(12) United States Patent
Xu et al.

(10) Patent No.: US 12,374,580 B2
(45) Date of Patent: Jul. 29, 2025

(54) METHOD FOR MANUFACTURING SHALLOW TRENCH ISOLATION

(71) Applicant: Shanghai Huali Integrated Circuit Corporation, Shanghai (CN)

(72) Inventors: Jin Xu, Shanghai (CN); Minjie Chen, Shanghai (CN); Zaifeng Tang, Shanghai (CN); Yu Ren, Shanghai (CN)

(73) Assignee: Shanghai Huali Integrated Circuit Corporation, Shanghai (CN)

( * ) Notice: Subject to any disclaimer, the term of this patent is extended or adjusted under 35 U.S.C. 154(b) by 639 days.

(21) Appl. No.: 17/674,098

(22) Filed: Feb. 17, 2022

(65) Prior Publication Data
US 2022/0277986 A1    Sep. 1, 2022

(30) Foreign Application Priority Data
Mar. 1, 2021    (CN) .......................... 202110226518.7

(51) Int. Cl.
*H01L 21/3065*    (2006.01)
*H01L 21/306*    (2006.01)
(Continued)

(52) U.S. Cl.
CPC .. *H01L 21/76229* (2013.01); *H01L 21/30604* (2013.01); *H01L 21/3065* (2013.01); *H10F 39/807* (2025.01)

(58) Field of Classification Search
CPC ......... H01L 21/76229; H01L 21/30604; H01L 21/3065; H01L 27/1463; H01L 27/14689;
(Continued)

(56) References Cited

U.S. PATENT DOCUMENTS 5,422,296 A * 6/1995 Lage .................. H10B 10/00
                                                       438/212
8,802,537 B1 * 8/2014 Wu ................... H01L 21/02057
                                                       438/297
(Continued)

FOREIGN PATENT DOCUMENTS

CN       109637973    *  4/2019

OTHER PUBLICATIONS

Stevic, Pauline. "KOH Etchant Standard Operating Procedure." Kavli Nanolab Delft, Apr. 26, 2018, filelist.tudelft.nl/TNW/Afdelingen/Quantum%20Nanoscience/Kavli%20Nanolab%20Delft/Equipment/KOH%20-%20Silicon%20Etching%20SOP.pdf. (Year: 2018).*
(Continued)

*Primary Examiner* — William B Partridge
*Assistant Examiner* — Felix B Andrews
(74) *Attorney, Agent, or Firm* — Banner & Witcoff, Ltd.

(57) ABSTRACT

The present application discloses a method for manufacturing shallow trench isolation, comprising: step 1: performing first time etching on a semiconductor substrate by means of a dry etching process to form the shallow trench, wherein in the first time etching, metal ions are released from a dry etching process chamber and deposited on the inner surface of the shallow trench, and the metal ions diffuse and form a contamination layer; and step 2: performing second time etching on the semiconductor substrate exposed on the inner surface of the shallow trench by means of a wet etching process to remove the contamination layer on the inner surface of the shallow trench. In the present application, the metal ions released from the dry etching process chamber and deposited on the inner surface of the shallow trench during the dry etching of the shallow trench can be removed.

10 Claims, 6 Drawing Sheets

(51) Int. Cl.
*H01L 21/762* (2006.01)
*H10F 39/00* (2025.01)

(58) Field of Classification Search
CPC ......... H01L 21/76224; H01L 27/14643; H10F 39/011; H10F 39/12; H10F 39/014; H10F 39/18
See application file for complete search history.

(56) References Cited

U.S. PATENT DOCUMENTS

| | | | | |
|---|---|---|---|---|
| 2006/0032833 A1* | 2/2006 | Kawaguchi | ......... | H01L 21/0206 216/37 |
| 2006/0141775 A1* | 6/2006 | Schuehrer | ......... | H01L 21/76807 438/638 |
| 2008/0042283 A1* | 2/2008 | Purushothaman | .. | H01L 23/5329 257/754 |
| 2010/0197133 A1* | 8/2010 | Werner | ............... | H01L 21/0337 257/E21.586 |
| 2013/0276837 A1* | 10/2013 | Tsai | ..................... | C11D 7/3218 134/34 |
| 2018/0144929 A1* | 5/2018 | Liu | .................. | H01L 21/31138 |

OTHER PUBLICATIONS

Stevic, Pauline. âKOH Etchant Standard Operating Procedure.â Kavli Nanolab Delft, Apr. 26, 2018, filelist.tudelft.nl/TNW/Afdelingen/Quantum%20Nanoscience/Kavli%20Nanolab%20Delft/Equipment/KOH%20-%20Silicon%20Etching%20SOP.pdf. (Year: 2018) (Year: 2018).*

* cited by examiner

Step 1: First time etching is performed on the semiconductor substrate in the formation area of the shallow trench by means of a dry etching process to form the shallow trench; in the first time etching, metal ions are released from the dry etching process chamber and deposited on the inner surface of the shallow trench, and the metal ions diffuse and form a contamination layer

↓

Step 2: Second time etching is performed on the semiconductor substrate exposed on the inner surface of the shallow trench by means of a wet etching process to remove the contamination layer on the inner surface of the shallow trench

FIG. 3

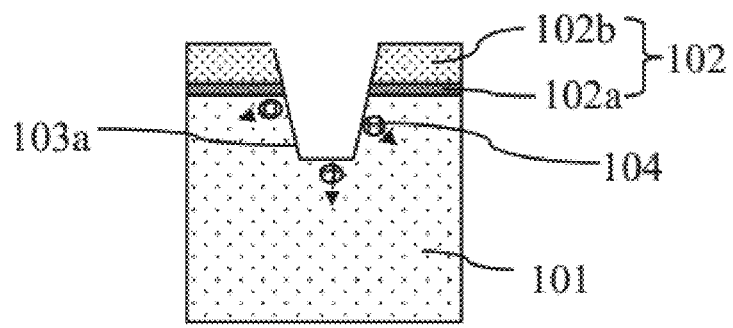

FIG. 4A

METHOD FOR MANUFACTURING SHALLOW TRENCH ISOLATION

CROSS-REFERENCES TO RELATED APPLICATIONS

This application claims priority to Chinese patent application No. 202110226518.7, filed on Mar. 1, 2021, the disclosure of which is incorporated herein by reference in its entirety.

TECHNICAL FIELD

The present application relates to a method for manufacturing a semiconductor integrated circuit, in particular to a method for manufacturing shallow trench isolation (STI).

BACKGROUND

An existing CMOS image sensor (CIS) consists of a pixel unit circuit and a CMOS circuit. Compared with a CCD image sensor, the CMOS image sensor has a better degree of integratability due to the CMOS standard production process adopted, can be integrated with other digital-analog operation and control circuits on the same chip, and thus is more applicable to the future development.

According to the number of transistors in the pixel unit circuit of the existing CMOS image sensor, the structure of the existing CMOS image sensor is mainly classified into a 3T structure and a 4T structure.

FIG. 1 is a schematic diagram of an equivalent circuit of a pixel unit circuit of an existing 3T CMOS image sensor. The pixel unit circuit of the existing 3T CMOS image sensor includes a photodiode D1 and a CMOS pixel readout circuit. The CMOS pixel readout circuit is a 3T pixel circuit, including a reset transistor M1, an amplifier transistor M2, and a selective transistor M3, each of which is an NMOS transistor.

An N-type area of the photodiode D1 is connected to the source of the reset transistor M1.

The gate of the reset transistor M1 is connected to a reset signal Reset, and the reset signal Reset is a potential pulse. When the reset signal Reset is at a high level, the reset transistor M1 is conductive and leads electrons of the photodiode D1 to the power supply Vdd of the readout circuit to implement reset. When irradiated by light, the photodiode D1 generates photo-generated electrons, the potential rises, and an electrical signal is transmitted via an amplification circuit. The gate of the selective transistor M3 is connected to a row selective signal Rs, to selectively output an amplified electrical signal, i.e., an output signal Vout.

FIG. 2 is a schematic diagram of an equivalent circuit of a pixel unit circuit of an existing 4T CMOS image sensor. The structure show in FIG. 2 differs from the structure show in FIG. 1 by including a transfer transistor, which is also referred to as a transmission transistor M4. A source area of the transfer transistor 4 is connected to the N-type area of the photodiode D1, a drain area of the transfer transistor 4 is a floating diffusion (FD) area, and the gate of the transfer transistor 4 is connected to a transmission control signal Tx. After being generated by the photodiode D1, the photo-generated electrons are transferred to the floating diffusion area by the transfer transistor 4, and then signal amplification is implemented by connecting the floating diffusion area to the gate of the amplifier transistor M2.

The pixel unit circuit of the existing CMOS image sensor is formed in a pixel area, and a CMOS circuit is formed in a logic area. An active area needs to be defined in both the pixel area and the logic area. The active area is formed by means of STI or local oxidation of silicon (LOCOS) isolation, that is, the semiconductor substrate in an STI or LOCOS surrounding area serves as the active area. The device structure is formed in the active area, for example, each device in the pixel unit circuit is formed in the active area of the pixel area. The STI or LOCOS can prevent mutual interference between devices in different active areas. The STI is formed by means of a shallow trench etching and filling process. The STI is applied to the definition of an active area of a smaller process node. The present application mainly aims at the improvement of a method for manufacturing STI, in particular at the improvement of a method for manufacturing STI applied to the CMOS image sensor.

In the existing CMOS image sensor, dual-depth shallow trench isolation is generally required due to different device isolation requirements of the pixel area and the logic area, in which case the depths of a shallow trench in the pixel area and the logic area are different. It is necessary to first form a dual-depth shallow trench during formation of the CMOS image sensor.

In the existing process, the shallow trench is usually formed by etching a semiconductor substrate, such as a silicon substrate, by means of a dry etching process. The dry etching process is performed in a dry etching process chamber, and components made of metal materials are used in the dry etching process chamber. During the dry etching process, plasma is used, and under the action of the plasma, a certain amount of metal ions are released from the dry etching process chamber and deposited on the surface of the shallow trench. The metal ions deposited on the surface of the shallow trench then diffuse into the semiconductor substrate on the surface of the shallow trench during a thermal process.

Generally, the metal ions released in the shallow trench etching impose no adverse impact on the device in the logic area, but such the metal ions have a great impact on the pixel area. The pixel area collects photons mainly by means of a depletion area of the photodiode, performs photoelectric conversion to form electrons, and detects an image by collecting the electrons of the photoelectric conversion. However, when there are metal ions in the active area of the pixel area, the metal ions, particularly heavy metal ions, may cause electric leakage. Such the electric leakage is actually not generated by the photoelectric conversion, but electrons thereof may be considered as electrons generated by the photoelectric conversion, and a white point is thus formed. If the number of the white points increases, the product yield decreases, and a large number of wafers may even be disabled. In a semiconductor integrated circuit, a wafer generally refers to a semiconductor substrate, such as a silicon substrate, wherein the silicon substrate is a single wafer with a circular structure.

In short, in the prior art, while the CMOS image sensor is used in an increasingly wide range, the following problems occur:

The CMOS image sensor is extremely sensitive to metal contamination, in particular to heavy metal contamination, wherein in a metal contamination test, the cycle is long, many interference factors exist, and a result is difficult to be determined accurately.

Due to the inherent characteristic of relatively high metal ion release rate in use of the plasma by the etching chamber for a work area etching process, metal contamination to the CMOS image sensor work area necessarily occurs, resulting in excessive white points and low wafer yield, even large-scale wafer disablement.

BRIEF SUMMARY

The technical problem to be solved by the present application is to provide a method for manufacturing shallow trench isolation, to remove metal ions released from a dry etching process chamber and deposited on the inner surface of a shallow trench during dry etching of the shallow trench, thereby eliminating the impact of the metal ions on the yield of a product, particularly a CMOS image sensor.

In order to solve the above technical problem, the method for manufacturing shallow trench isolation provided by the present application comprises the following steps:

step 1: providing a semiconductor substrate, defining a formation area of a shallow trench, and performing first time etching on the semiconductor substrate in the formation area of the shallow trench by means of a dry etching process to form the shallow trench, wherein the first time etching is performed in a dry etching process chamber, in the first time etching, metal ions are released from the dry etching process chamber and deposited on the inner surface of the shallow trench, and the metal ions deposited on the inner surface of the shallow trench diffuse into the semiconductor substrate on the inner surface of the shallow trench and form a contamination layer; and step 2: performing second time etching on the semiconductor substrate exposed on the inner surface of the shallow trench by means of a wet etching process to remove the contamination layer on the inner surface of the shallow trench, wherein the semiconductor substrate underwent the second time etching and surrounded by the shallow trench forms an active area.

In a further improvement, after step 2, the method further comprises filling the shallow trench with a first oxide layer to form shallow trench isolation.

In a further improvement, the semiconductor substrate comprises a silicon substrate.

In a further improvement, the semiconductor substrate is used to form a CMOS image sensor, and the CMOS image sensor comprises a pixel area and a logic area.

The shallow trench comprises a first shallow trench and a second shallow trench.

The first shallow trench is a shallow trench in the pixel area, and the second shallow trench is a shallow trench in the logic area.

In a further improvement, the depth of the second shallow trench is greater than the depth of the first shallow trench.

In a further improvement, a hard mask layer is used for defining the formation area of the shallow trench, and step 1 comprises the following sub-steps:

step 11: forming the hard mask layer on the surface of the semiconductor substrate;

step 12: patterning the hard mask layer, wherein an opening of the patterned hard mask layer opens the formation area of the shallow trench; and step 13: then performing the first time etching by using the patterned hard mask layer as a mask.

In a further improvement, before the second time etching in step 2, the method further comprises performing third time etching on the hard mask layer by means of a wet etching process, wherein the third etching time expands the opening of the hard mask layer.

In a further improvement, the hard mask layer is formed by stacking a second oxide layer and a third nitride layer.

In a further improvement, in the third time etching, phosphoric acid is used to etch the third nitride layer, and hydrofluoric acid is used to etch the second oxide layer.

In a further improvement, after the hard mask layer is patterned in step 12, a formation area of the first shallow trench and a formation area of the second shallow trench are defined simultaneously.

In step 13, the first time etching is divided into first step dry etching and second step dry etching, and step 13 comprises the following sub-steps:

step 131: performing the first step dry etching to simultaneously etch the semiconductor substrate in the formation area of the first shallow trench and the semiconductor substrate in the formation area of the second shallow trench until the depth of the first shallow trench reaches a target value, wherein the first step dry etching forms the first shallow trench and a portion of the second shallow trench;

step 132: forming a second mask layer to cover the pixel area and open the logic area;

step 133: performing the second step dry etching to continue etching the semiconductor substrate in the formation area of the second shallow trench until the depth of the second shallow trench reaches a target value, wherein the second shallow trench is formed after the second step dry etching is completed; and step 134: removing the second mask layer.

In a further improvement, in step 132, the material of the second mask layer comprises a photoresist, and a pattern structure of the second mask layer is formed by means of photoresist coating, exposure, and development.

In a further improvement, in step 134, the second mask layer is removed by means of a photoresist stripping process and a wet cleaning process.

In a further improvement, in step 2, a wet etchant for the second time etching comprises: KOH, NaOH or TMAH.

In a further improvement, in step 2, the thickness of the semiconductor substrate removed by the second time etching is more than 30 Å.

In the present application, after the dry etching process of the shallow trench, the wet etching process is performed to remove the semiconductor substrate contaminated by the metal ions released from the dry etching process chamber during the dry etching process of the shallow trench, i.e., the contamination layer on the inner surface of the shallow trench. Therefore, in the present application, the metal ions released from the dry etching process chamber and deposited on the inner surface of the shallow trench during the dry etching of the shallow trench can be removed.

The CMOS image sensor is extremely sensitive to metal ion contamination, in particular to heavy metal ion contamination. In the present application, white points in the CMOS image sensor can be reduced by removing the metal ions deposited on the inner surface of the shallow trench during the dry etching of the shallow trench, thereby improving the yield of the CMOS image sensor and avoiding large-scale wafer disablement.

BRIEF DESCRIPTION OF THE DRAWINGS

The present application will be further described in detail below with reference to the drawings and specific implementations:

FIG. 3 is a flowchart of a method for manufacturing shallow trench isolation according to an embodiment of the present application.

FIGS. 4A-4C are schematic diagrams of device structures in steps of the method for manufacturing shallow trench isolation according to an embodiment of the present application.

DETAILED DESCRIPTION OF THE DISCLOSURE

Figure 1:
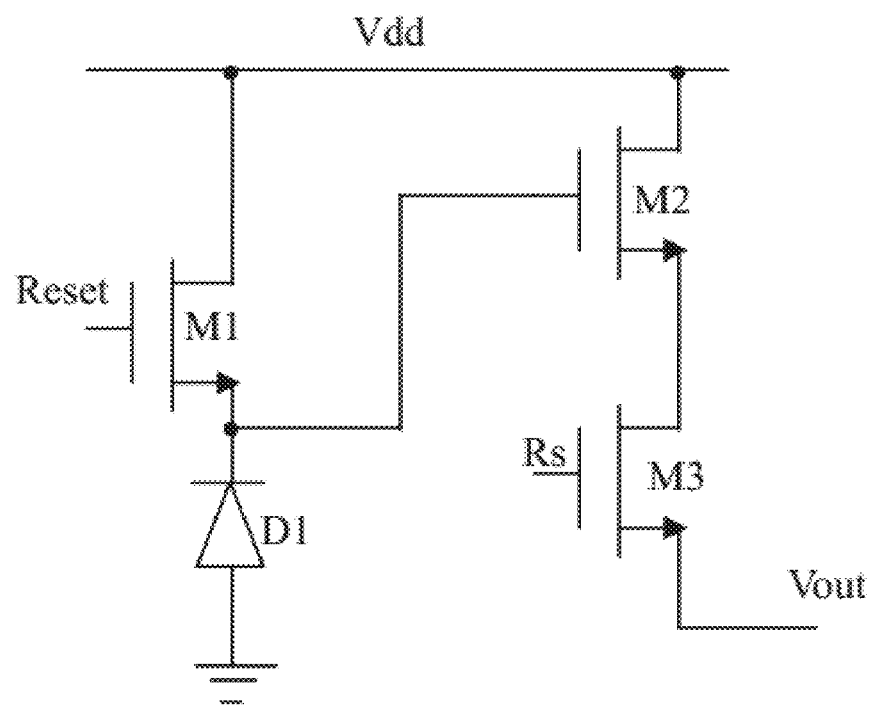
FIG. 1 is a schematic diagram of an equivalent circuit of a pixel unit circuit of an existing 3T CMOS image sensor.
Figure 2:
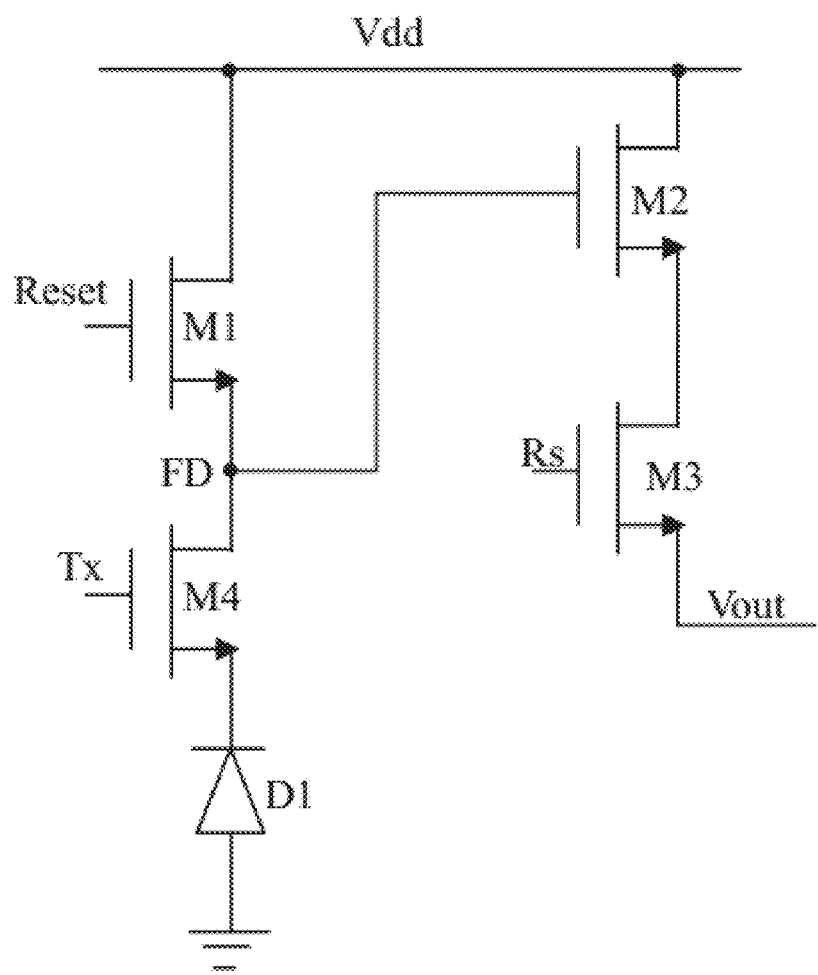
FIG. 2 is a schematic diagram of an equivalent circuit of a pixel unit circuit of an existing 4T CMOS image sensor.
Figure 4B:
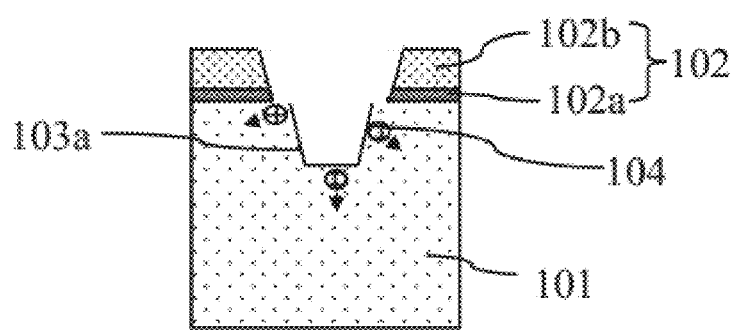
Figure 4C:
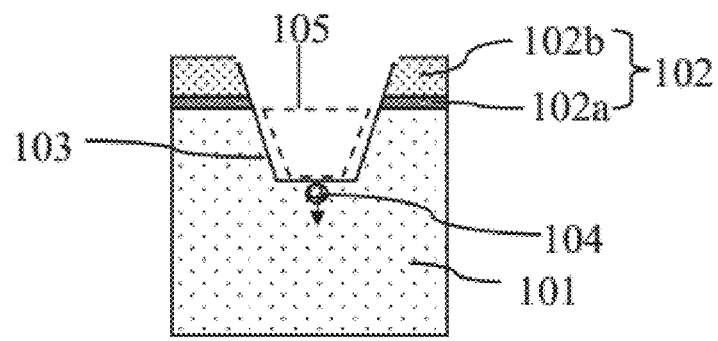

FIG. 3 is a flowchart of a method for manufacturing shallow trench isolation according to an embodiment of the present application. FIGS. 4A-4C are schematic diagrams of device structures in steps of the method for manufacturing shallow trench isolation according to an embodiment of the present application. The method for manufacturing shallow trench isolation according to the embodiment of the present application includes the following steps.

Step 1: Referring to FIG. 4A, a semiconductor substrate 101 is provided, a formation area of a shallow trench 103a is defined, and first time etching is performed on the semiconductor substrate 101 in the formation area of the shallow trench 103a by means of a dry etching process to form the shallow trench 103a. In FIG. 4A, the shallow trench formed after the first time etching is independently indicated with a mark 103a.

The semiconductor substrate 101 includes a silicon substrate.

The first time etching is performed in a dry etching process chamber. In the first time etching, metal ions 104 are released from the dry etching process chamber and deposited on the inner surface of the shallow trench 103a, and the metal ions 104 deposited on the inner surface of the shallow trench 103a diffuse into the semiconductor substrate 101 on the inner surface of the shallow trench 103a and form a contamination layer. In FIG. 4A, an arrow line at the metal ions 104 indicates the diffusion of the metal ions 104, and the metal ions 104 diffuse during a thermal process.

In the embodiment of the present application, a hard mask layer 102 is used for defining the formation area of the shallow trench 103a, and step 1 includes the following sub-steps:

Step 11. The hard mask layer 102 is formed on the surface of the semiconductor substrate 101.

The hard mask layer 102 is formed by stacking a second oxide layer 102a and a third nitride layer 102b.

Step 12: The hard mask layer 102 is patterned, wherein an opening of the patterned hard mask layer 102 opens the formation area of the shallow trench 103a.

Generally, the hard mask layer 102 is patterned by means of a photolithography and etching process, including: performing photoresist coating, exposure, and development to form a photoresist pattern, then etching the hard mask layer 102 by using the photoresist pattern as a mask, and then removing the photoresist pattern.

Step 13. Then the first time etching is performed by using the patterned hard mask layer 102 as a mask.

Step 2: Referring to FIG. 4C, second time etching is performed on the semiconductor substrate 101 exposed on the inner surface of the shallow trench 103a by means of a wet etching process to remove the contamination layer on the inner surface of the shallow trench 103a, wherein the semiconductor substrate 101 underwent the second time etching and surrounded by the shallow trench 103a forms an active area. In FIG. 4C, the shallow trench formed after the second time etching is independently indicated with a mark 103.

In step 2, a wet etchant for the second time etching is TMAH. In other embodiments, the wet etchant for the second time etching may include KOH or NaOH.

In step 2, the thickness of the semiconductor substrate 101 removed by the second time etching is more than 30 Å.

In the embodiment of the present application, if TMAH is used for the second time etching, different crystal orientations of the semiconductor substrate 101 correspond to different etching rates. In the second time etching, an etching rate on the surface (110) is greater than an etching rate on the surface (100), and the etching rate on the surface (100) is greater than an etching rate on the surface (111). In the embodiment of the present application, an etching rate of the second time etching on the side surface of the shallow trench 103a is greater than an etching rate on the bottom surface, so as to ensure that the metal ions 104 on the side surface of the shallow trench 103 are completely removed after the second time etching, with some of the metal ions 104 on the bottom surface of the shallow trench 103 not removed, which, however, do not impose an adverse impact on the performance of the device because the active area is formed by the semiconductor substrate 101 surrounded by the shallow trench 103. A dashed line box 105 in FIG. 4C represents the formation area of the shallow trench 103a defined before the second time etching. It can be seen that, after the second time etching, the width of the shallow trench 103 is expanded to some extent. By pre-defining the formation area of the shallow trench 103a in step 1, the width of the finally formed shallow trench 103 can exactly match a required value.

In the embodiment of the present application, referring to FIG. 4B, before the second time etching in step 2, the method further includes performing third time etching on the hard mask layer 102 by means of a wet etching process, wherein the third etching time expands the opening of the hard mask layer 102.

In the third time etching, phosphoric acid is used to etch the third nitride layer, and hydrofluoric acid is used to etch the second oxide layer 102a.

After step 2, the method further includes filling the shallow trench 103a with a first oxide layer to form shallow trench isolation.

In the embodiment of the present application, after the dry etching process of the shallow trench, the wet etching process is performed to remove the semiconductor substrate 101 contaminated by the metal ions 104 released from the dry etching process chamber during the dry etching process of the shallow trench, i.e., the contamination layer on the inner surface of the shallow trench. Therefore, in the present application, the metal ions 104 released from the dry etching process chamber and deposited on the inner surface of the shallow trench during the dry etching of the shallow trench can be removed.

The CMOS image sensor is extremely sensitive to metal ion contamination, in particular to heavy metal ion contamination. In the present application, white points in the CMOS image sensor can be reduced by removing the metal ions deposited on the inner surface of the shallow trench during the dry etching of the shallow trench, thereby improving the yield of the CMOS image sensor and avoiding large-scale wafer disablement.

FIGS. 5A-5E are schematic diagrams of device structure in steps of the method for manufacturing shallow trench isolation according to a preferred embodiment of the present application. The method for manufacturing shallow trench isolation according to the preferred embodiment of the present application includes the following steps.

Figure 5A:
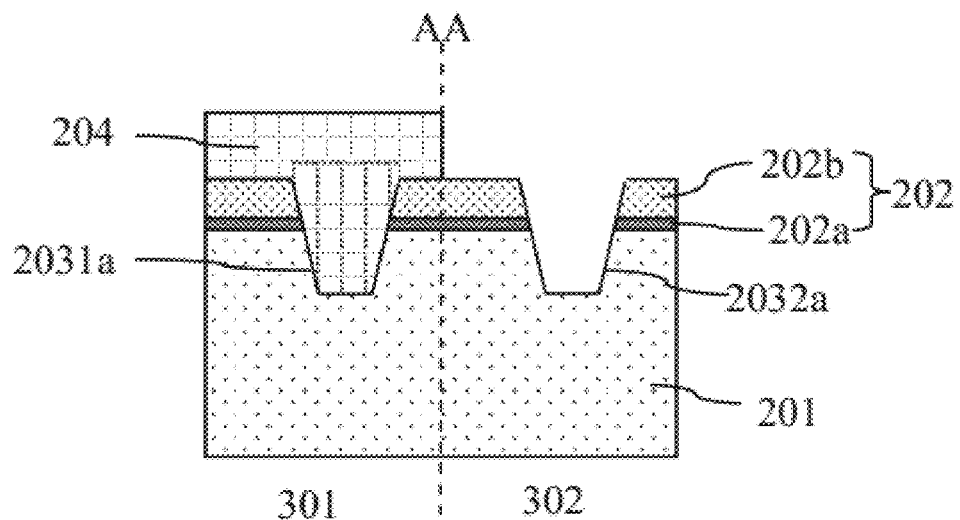
FIGS. 5A-5E are schematic diagrams of device structure in steps of the method for manufacturing shallow trench isolation according to a preferred embodiment of the present application.

Step 1: Referring to FIG. 5A, a semiconductor substrate 201 is provided, a formation area of a shallow trench is defined, and first time etching is performed on the semiconductor substrate 201 in the formation area of the shallow trench by means of a dry etching process to form the shallow trench. The semiconductor substrate 201 includes a silicon substrate.

Figure 5B:
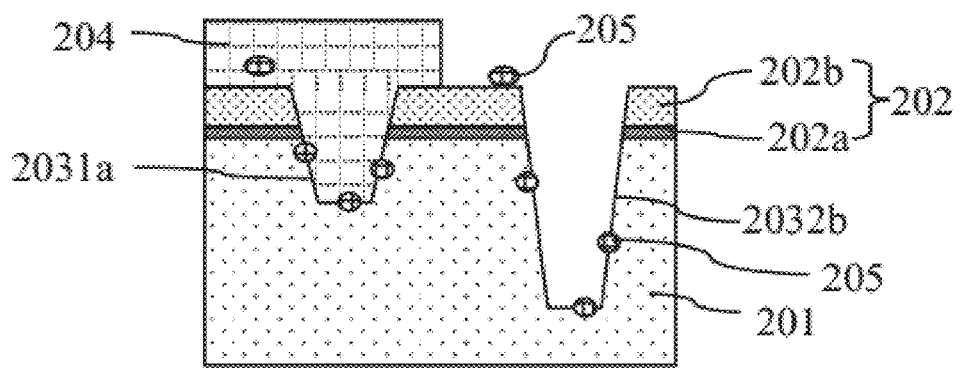
Figure 5C:
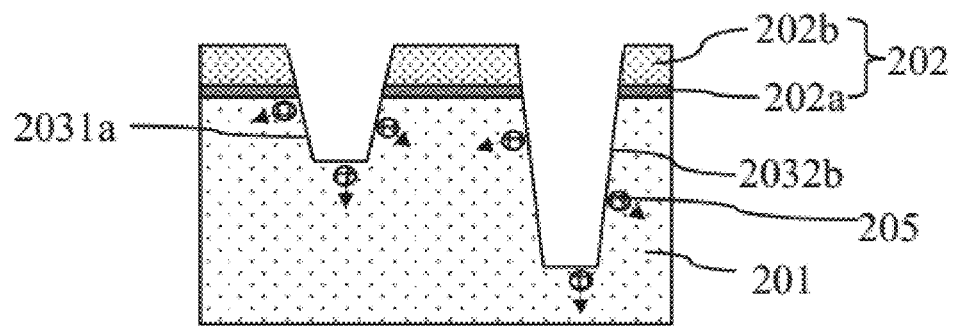

Referring to FIG. 5B, the first time etching is performed in a dry etching process chamber. In the first time etching, metal ions 205 are released from the dry etching process chamber and deposited on the inner surface of the shallow trench, and the metal ions 205 deposited on the inner surface of the shallow trench diffuse into the semiconductor substrate 201 on the inner surface of the shallow trench and form a contamination layer. In FIG. 5C, an arrow line at the metal ions 205 indicates the diffusion of the metal ions 205, and the metal ions 205 diffuse during a thermal process.

In the preferred embodiment of the present application, referring to FIG. 5A, the semiconductor substrate 201 is used to form a CMOS image sensor, and the CMOS image sensor includes a pixel area 301 and a logic area 302. In FIG. 5A, the pixel area 301 and the logic area 302 are arranged on two sides of a dashed line AA.

Figure 5D:
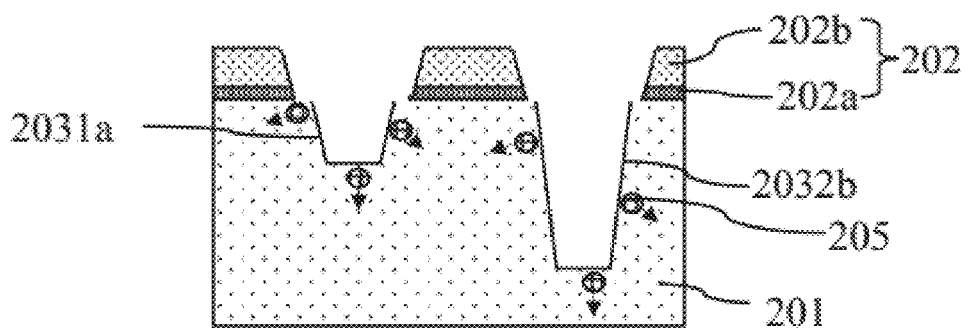
Figure 5E:
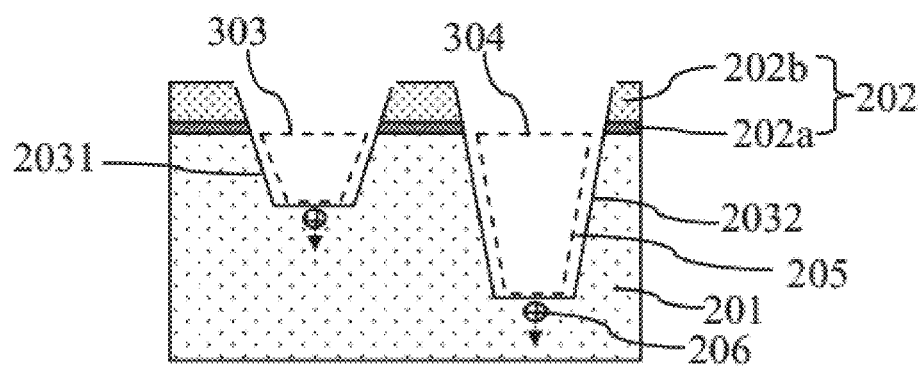

First referring to FIG. 5E, the shallow trench includes a first shallow trench 2031 and a second shallow trench 2032.

The first shallow trench 2031 is a shallow trench in the pixel area 301, and the second shallow trench 2032 is a shallow trench in the logic area 302.

The depth of the second shallow trench 2032 is greater than the depth of the first shallow trench 2031.

Referring to FIG. 5A, a hard mask layer 202 is used for defining the formation area of the shallow trench, and step 1 includes the following sub-steps:

Step 11: The hard mask layer 202 is formed on the surface of the semiconductor substrate 201.

The hard mask layer 202 is formed by stacking a second oxide layer 202a and a third nitride layer 202b.

Step 12: The hard mask layer 202 is patterned, wherein an opening of the patterned hard mask layer 202 opens the formation area of the shallow trench.

Generally, the hard mask layer 202 is patterned by means of a photolithography and etching process, including: performing photoresist coating, exposure, and development to form a photoresist pattern, then etching the hard mask layer 202 by using the photoresist pattern as a mask, and then removing the photoresist pattern.

Referring to FIG. 5A, after the hard mask layer 202 is patterned in step 12, a formation area of the first shallow trench 2031a and a formation area of the second shallow trench are defined simultaneously. In FIG. 5A, the first shallow trench is independently indicated with a mark 2031a. Only a portion of the second shallow trench is shown in FIG. 5A, and the portion of the second shallow trench is independently indicated with a mark 2032a. An open area of the patterned hard mask layer 202 is used to define the formation area of the first shallow trench corresponding to the mark 2031a and the formation area of the second shallow trench corresponding to the mark 2032a.

Step 13: Then the first time etching is performed by using the patterned hard mask layer 202 as a mask. In step 13, the first time etching is divided into first step dry etching and second step dry etching, and step 13 includes the following sub-steps.

Step 131: Referring to FIG. 5A, the first step dry etching is performed to simultaneously etch the semiconductor substrate 201 in the formation area of the first shallow trench 2031a and the semiconductor substrate 201 in the formation area of the second shallow trench 2032a until the depth of the first shallow trench 2031a reaches a target value, wherein the first step dry etching forms the first shallow trench 2031a and a portion 2032a of the second shallow trench.

Step 132: Referring to FIG. 5A, a second mask layer 204 is formed to cover the pixel area 301 and open the logic area 302.

Step 133: Referring to FIG. 5B, the second step dry etching is performed to continue etching the semiconductor substrate 201 in the formation area of the second shallow trench until the depth of the second shallow trench reaches a target value, wherein the second shallow trench 2032b is formed after the second step dry etching is completed. In FIG. 5B, the second shallow trench formed after the second step dry etching is independently indicated with a mark 2032b.

The metal ions 205 deposited in the second step dry etching are shown in FIG. 5B. The metal ions 205 are located on the surface of the second mask layer 204 of the pixel area 301 and on the surface of the hard mask layer 202 and the inner surface of the second shallow trench 2032b of the logic area.

In the preferred embodiment of the present application, the material of the second mask layer 204 includes a photoresist, and a pattern structure of the second mask layer 204 is formed by means of photoresist coating, exposure, and development. Due to the soft physical property of the photoresist, the metal ions 205 on the surface of the second mask layer 204 gradually move to the surface of the first shallow trench 302a.

Step 134: Referring to FIG. 5C, the second mask layer 204 is removed.

The second mask layer 204 is removed by means of a photoresist stripping process and a wet cleaning process.

The metal ions 205 on the surfaces of the first shallow trench 2031a and the second shallow trench 2032b diffuse into the semiconductor substrate 201 during the thermal process, for example, the diffusion of the metal ions 205 occurs during a high-temperature photoresist removing process. An arrow line corresponding to the metal ions 205 in FIG. 5C represents the diffusion of the metal ions 205, and an area where the metal ion 205 diffuses in the semiconductor substrate 201 forms the contamination layer.

Step 2: Referring to FIG. 5E, second time etching is performed on the semiconductor substrate 201 exposed on the inner surface of the shallow trench by means of a wet etching process to remove the contamination layer on the inner surface of the shallow trench, wherein the semiconductor substrate 201 underwent the second time etching and surrounded by the shallow trench forms an active area.

A wet etchant for the second time etching is TMAH. In other embodiments, the wet etchant for the second time etching may include KOH or NaOH.

The thickness of the semiconductor substrate 101 removed by the second time etching is more than 30 Å.

In the preferred embodiment of the present application, if TMAH is used for the second time etching, different crystal orientations of the semiconductor substrate 201 correspond to different etching rates. In the second time etching, an etching rate on the surface (110) is greater than an etching rate on the surface (100), and the etching rate on the surface (100) is greater than an etching rate on the surface (111). In the preferred embodiment of the present application, an etching rate of the second time etching on the side surface of the shallow trench is greater than an etching rate on the bottom surface, so as to ensure that the metal ions 205 on the side surface of the shallow trench are completely removed after the second time etching, with some of the metal ions 205 on the bottom surface of the shallow trench not removed, which, however, do not impose an adverse impact on the performance of the device because the active area is formed by the semiconductor substrate 201 surrounded by the shallow trench. In FIG. 5E, a dashed line box 303 represents the formation area of the first shallow trench 2031a defined before the second time etching, and a dashed line box 304 represents the formation area of the second shallow trench 2032b defined before the second time etching. It can be seen that, after the second time etching, the widths of the first shallow trench 2031 and the second shallow trench 2032 both are expanded to some certain extent. By pre-defining the formation areas of the first shallow trench 2031a and the second shallow trench in step 1, the widths of the finally formed first shallow trench 2031 and second shallow trench 2032 can exactly match required values.

In the preferred embodiment of the present application, referring to FIG. 5D, before the second time etching in step 2, the method further includes performing third time etching on the hard mask layer 202 by means of a wet etching process, wherein the third etching time expands the opening of the hard mask layer 202.

In the third time etching, phosphoric acid is used to etch the third nitride layer, and hydrofluoric acid is used to etch the second oxide layer 202a.

After step 2, the method further includes filling the shallow trench with a first oxide layer to form shallow trench isolation.

The present application is described in detail above via specific embodiments, but these embodiments are not intended to limit the present application. Without departing from the principle of the present application, those skilled in the art can still make many variations and improvements, which should also be considered to fall into the protection scope of the present application.

What is claimed is:

1. A method for manufacturing shallow trench isolation, comprising the following steps:
   step 1: providing a semiconductor substrate, defining a formation area of a shallow trench, and performing a first time etching on the semiconductor substrate in the formation area of the shallow trench by means of a dry etching process to form the shallow trench, wherein the first time etching is performed in a dry etching process chamber, in the first time etching, metal ions are released from the dry etching process chamber and deposited on an inner surface of the shallow trench, and the metal ions deposited on the inner surface of the shallow trench diffuse into the semiconductor substrate on the inner surface of the shallow trench and form a contamination layer,
   wherein the semiconductor substrate comprises a silicon substrate,
   wherein the semiconductor substrate is used to form a CMOS image sensor, and the CMOS image sensor comprises a pixel area and a logic area,
   the shallow trench comprises a first shallow trench and a second shallow trench, the first shallow trench is a shallow trench in the pixel area, and the second shallow trench is a shallow trench in the logic area; and
   step 2: performing a second time etching on the semiconductor substrate exposed on the inner surface of the shallow trench by means of a wet etching process to remove the contamination layer on the inner surface of the shallow trench, wherein the semiconductor substrate underwent the second time etching and a region surrounding the shallow trench forms an active area,
   wherein a hard mask layer is used for defining the formation area of the shallow trench, and step 1 comprises the following sub-steps:
   step 11: forming the hard mask layer on a surface of the semiconductor substrate;
   step 12: patterning the hard mask layer, wherein an opening of the patterned hard mask layer opens the formation area of the shallow trench; and
   step 13: then performing the first time etching by using the patterned hard mask layer as a mask, and
   before the second time etching in step 2, further comprising performing a third time etching on the hard mask layer by means of a wet etching process, wherein the third time etching expands the opening of the hard mask layer.

2. The method for manufacturing shallow trench isolation according to claim 1, after step 2, further comprising filling the shallow trench with a first oxide layer to form shallow trench isolation.

3. The method for manufacturing shallow trench isolation according to claim 1, wherein a depth of the second shallow trench is greater than a depth of the first shallow trench.

4. The method for manufacturing shallow trench isolation according to claim 3, wherein, after the hard mask layer is patterned in step 12, a formation area of the first shallow trench and a formation area of the second shallow trench are defined simultaneously; and
   in step 13, the first time etching is divided into a first step dry etching and a second step dry etching, and step 13 comprises the following sub-steps:
   step 131: performing the first step dry etching to simultaneously etch the semiconductor substrate in the formation area of the first shallow trench and the semiconductor substrate in the formation area of the second shallow trench until the depth of the first shallow trench reaches a target value, wherein the first step dry etching forms the first shallow trench and a portion of the second shallow trench;
   step 132: forming a second mask layer to cover the pixel area and open the logic area;
   step 133: performing the second step dry etching to continue etching the semiconductor substrate in the formation area of the second shallow trench until the depth of the second shallow trench reaches a target value, wherein the second shallow trench is formed after the second step dry etching is completed; and
   step 134: removing the second mask layer.

5. The method for manufacturing shallow trench isolation according to claim 4, wherein, in step 132, a material of the second mask layer comprises a photoresist, and a pattern structure of the second mask layer is formed by means of photoresist coating, exposure, and development.

6. The method for manufacturing shallow trench isolation according to claim 5, wherein, in step 134, the second mask layer is removed by means of a photoresist stripping process and a wet cleaning process.

7. The method for manufacturing shallow trench isolation according to claim 1, wherein the hard mask layer is formed by stacking a second oxide layer and a third nitride layer.

8. The method for manufacturing shallow trench isolation according to claim 7, wherein, in the third time etching, phosphoric acid is used to etch the third nitride layer, and hydrofluoric acid is used to etch the second oxide layer.

9. The method for manufacturing shallow trench isolation according to claim 1, wherein, in step 2, a wet etchant for the second time etching comprises: KOH, NaOH or TMAH.

10. The method for manufacturing shallow trench isolation according to claim 1, wherein, in step 2, an etching thickness of the second time etching is more than 30 Å.

* * * * *